(12) United States Patent
Bhatia et al.

(10) Patent No.: US 8,001,433 B1
(45) Date of Patent: Aug. 16, 2011

(54) SCAN TESTING ARCHITECTURES FOR POWER-SHUTOFF AWARE SYSTEMS

(75) Inventors: Sandeep Bhatia, San Jose, CA (US); Patrick Gallagher, Apalachin, NY (US); Brian Foutz, Silver Spring, MD (US); Vivek Chickermane, Ithaca, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 340 days.

(21) Appl. No.: 12/345,950

(22) Filed: Dec. 30, 2008

(51) Int. Cl.
*G01R 31/28* (2006.01)
*G06F 17/50* (2006.01)

(52) U.S. Cl. ......... 714/729; 714/727; 716/133; 716/136

(58) Field of Classification Search .................. 714/726, 714/727, 729; 716/133, 136
See application file for complete search history.

(56) References Cited

U.S. PATENT DOCUMENTS

| | | | |
|---|---|---|---|
| 6,782,501 | B2 | 8/2004 | Distler et al. |
| 7,103,816 | B2 | 9/2006 | Distler et al. |
| 7,647,540 | B2 * | 1/2010 | Rajski et al. .................. 714/738 |
| 7,779,320 | B2 * | 8/2010 | Chmelar ........................ 714/726 |
| 7,779,381 | B2 * | 8/2010 | Chickermane et al. ....... 716/111 |
| 2005/0149799 | A1 * | 7/2005 | Hemia et al. .................. 714/726 |
| 2008/0276140 | A1 * | 11/2008 | Gemmeke et al. ............ 714/726 |
| 2009/0135961 | A1 * | 5/2009 | Gemmeke et al. ............ 375/340 |
| 2009/0160544 | A1 * | 6/2009 | Otsuga et al. ................. 327/564 |
| 2009/0326854 | A1 * | 12/2009 | Chakravadhanula et al. 702/119 |
| 2010/0153759 | A1 * | 6/2010 | Singhal ......................... 713/322 |

OTHER PUBLICATIONS

Shih-Ping Lin; Chung-Len Lee; Jwu-E Chen; Ji-Jan Chen; Kun-Lun Luo; Wen-Ching Wu; , "A Multilayer Data Copy Test Data Compression Scheme for Reducing Shifting-in Power for Multiple Scan Design," Very Large Scale Integration (VLSI) Systems, IEEE Transactions on , vol. 15, No. 7, pp. 767-776, Jul. 2007 doi: 10.1109/TVLSI.2007.899232.*

Jia Li; Xiao Liu; Yubin Zhang; Yu Hu; Xiaowei Li; Qiang Xu; , "On capture power-aware test data compression for scan-based testing," Computer-Aided Design, 2008. ICCAD 2008. IEEE/ACM International Conference on , vol., no., pp. 67-72, Nov. 10-13, 2008 doi: 10.1109/ICCAD.2008.4681553.*

Xijiang Lin; Rajski, J.; , "Test Power Reduction by Blocking Scan Cell Outputs," Asian Test Symposium, 2008. ATS '08. 17th , vol., no., pp. 329-336, Nov. 24-27, 2008 doi: 10.1109/ATS.2008.33.*

N. Badereddine; Z. Wang; P. Girard; K. Chakrabarty; S. Pravossoudovitch; C. Landrault; , "Power-Aware Test Data Compression for Embedded IP Cores," Test Symposium, 2006. ATS '06. 15th Asian , vol., no., pp. 5-10, Nov. 2006 doi: 10.1109/ATS.2006.260985.*

(Continued)

*Primary Examiner* — Cynthia Britt (74) *Attorney, Agent, or Firm* — Schwegman, Lundberg & Woessner, P.A.

(57) ABSTRACT

In a circuit adapted for scan testing, a first set of connections configures the circuit elements into power domains with separate power-level controls, and a second set of connections configures the circuit elements to form scan segments for loading values into circuit elements from input ends of the scan segments and unloading values from circuit elements at output ends of the scan segments. A decompressor circuit receives a decompressor input and is operatively connected to the scan-segment input ends, and a compressor circuit is operatively connected to the scan segment output ends and generates a compressor output. Isolation circuits at scan-segment exits set values for scan segments at scan-segment exits when a corresponding independent power domain is in a power-off state.

21 Claims, 8 Drawing Sheets

OTHER PUBLICATIONS

C. Barnhart, V. Brunkhorst, F. Distler, O. Farnsworth, A. Ferko, B. Keller, D. Scott, T. Onodera and B. Koenemann, "Extending OPMISR beyond 10x Scan Test Efficiency," Design & Test of Computers, IEEE, Sep.-Oct. 2002, pp. 65-73.

C. Barnhart, V. Brunkhorst, F. Distler, O. Farnsworth, B. Keller and B. Koenemann, "OPMISR: The Foundation for Compressed ATPG Vetors," Proc IEEE International Test Conf (ITC 01), IEEE CS Press, Los Alamitos, Calif., 2001, pp. 748-757.

Y. Bonhomme et al., "A Gated Clock Scheme for Low Power Scan Testing of Logic ICs or Embedded Cores," Proc. 10th Asian Test Symp. (ATS 01), IEEE CS Press, Los Alamitos, Calif., 2001, pp. 253-258.

A. Chandra and K. Chakrabarty, "Combining Low-Power Scan Testing and Test Data Compression for System-on-a-Chip," Proc. 38th ACM/IEEE Design Auto. Conf. (DAC 01), ACM Press, New York, 2001, pp. 166-169.

V. Chickermane, B. Foutz, and B. Keller, "Channel Masking Synthesis for Efficient On-Chip Test Compression," Proc. IEEE International Test Conf (ITC 04), IEEE CS Press, Los Alamitos, Calif., 2004, pp. 452-461.

F. Corno et al., "A Test Pattern Generation Methodology for Low Power Consumption", in Proc. 16th VLSI Test Symp. (VTS 98), IEEE CS Press, Los Alamitos, Calif., 1998, pp. 453-459.

V. Dabholkar, S. Chakravarty, I. Pomeranz, and S.M. Reddy, "Techniques for Minimizing Power Dissipation in Scan and Combinational Circuits During Test Application," IEEE Trans. on Computer-Aided Design, vol. 17, No. 12, pp. 1325-1333, Dec. 1998.

P. Girard et al., "A Test Vector Ordering Technique for Switching Activity Reduction during Test Operation" in Proc. 9th Great Lakes Symp. on VLSI (GLS-VLSI 99), IEEE CS Press, Los Alamitos, Calif., 1998, pp. 24-27.

P. Girard et al., "Reducing Power Consumption during Test Application by Test Vector Ordering," Proc. Int'l Symp. Circuits and Systems (ISCAS 98), Part II, IEEE CS Press, Los Alamitos, Calif., 1998, pp. 296-299.

J. Li, Y. Hu, and X. Li, "A Scan Chain Adjustment Technology for Test Power Reduction," Proc. 15th Asian Test Symp, IEEE, 2006, pp. 11-16.

J. Rajski, et. al., "Embedded Deterministic Test for Low-Cost Manufacturing Test", Proc IEEE International Test Conf (ITC 01), IEEE CS Press, Los Alamitos, Calif., 2002, pp. 301-310, 2002.

R. Sankaralingam, R. Oruganti, and N.A. Touba, "Static Compaction Techniques to Control Scan Vector Power Dissipation" in Proc. 18th VLSI Test Symp. (VTS 00), IEEE CS Press, Los Alamitos, Calif., 2000, pp. 35-42.

O. Sinanoglu and A. Orailoglu, "Modeling Scan Chain Modifications for Scan-in Test Power Minimization", ITC International Test Conference, Paper 24.1, IEEE 2003, pp. 602-611.

S. Wang and S.K. Gupta, "ATPG for Heat Dissipation Minimization During Test Application," IEEE Trans. Computers, vol. 47, No. 2, Feb. 1998, pp. 256-262.

\* cited by examiner

SCAN TESTING ARCHITECTURES FOR POWER-SHUTOFF AWARE SYSTEMS

BACKGROUND OF THE INVENTION

1. Field of Invention

The present invention relates to Integrated Circuits (ICs) and more particularly to testing ICs with power-shutoff features.

2. Description of Related Art

The use of scan chains greatly simplifies the chip testing process for Application Specific Integrated Circuits (ASICs). Automatic test pattern generation (ATPG) techniques can assume each sequential element of the chip can be controlled as well as observed. Typically the ATPG system generates a number of test patterns and test responses. The test patterns are loaded into the chip through the scan chains, the test is executed, typically by running the chip through one or more clock cycles, and the resulting response is scanned out and compared to the expected good response. When there is a mismatch, the chip is identified as faulty, and if needed the mismatches from one or more patterns can be analyzed to determine the likely location of the failure on the chip.

However, scan testing is a power intensive process. In many cases the test pattern and the response data is very similar to random 0's and 1's, causing close to 50% of sequential elements in the design to change state during each shift of the scan load and unload process (the scan pattern for the next test can be loaded at the same time the response from the previous test is unloaded). This percentage is much greater than that typically found during normal chip operation. The percentage of the chip's logic that toggles while executing the test is also much higher than what is seen during normal functional operation. If the power aspects of scan testing are not addressed, it's possible that good chips will fail the testing process due to power droop caused by scan test's excessive power requirements. This effectively increasing the chip's manufacturing cost.

As a result, issues related to power consumption during manufacturing scan testing have been examined in some contexts. In the past, it was often possible to reduce average power consumption by reducing the scan speed, albeit at the expense of longer test time and increased test cost. However, today's scan load/unload clock frequency is typically much slower than the system clock frequency, and power consumption from timed delay or at-speed tests as well as instantaneous switching power during scan shifting has become an issue. (In general, instantaneous switching power is the power consumed by an individual clock pulse and cannot be reduced by lowering the scan shift clock frequency.) The problem in these cases is that the clock events trigger enough switching activity in the circuit that voltage droop occurs and parts of the circuit operate incorrectly. When this occurs during scan shifting, power problems appear to manifest themselves as one or more broken scan chains. During timed tests or during the capture of the test response, power problems appear as false failures.

Several techniques have been proposed to address the power issues that result from excessive switching activity. Some have tackled the problem during the generation of the test vectors through modification of the ATPG algorithm. Others have proposed a reordering of the scan cells and data vectors based on an previously generated set of ATPG vectors. Test vector ordering is another approach which is shown to reduce power consumption by as much as 50%. Special vector compaction and data compression is also shown effective at reducing power. Finally, clock modification schemes can also be used. Because many of these techniques tackle the power consumption problem in different ways, many of these techniques can be used together to reduce power consumption even further.

Many modern system-on-chip designs incorporate sophisticated techniques to control power requirements during functional operation. One such technique, known as power shut-off, allows an unused sub-component of the chip to power off while other parts of the chip remain operative. Power shut-off capabilities offer new challenges during manufacturing test, but also present unique opportunities. Performing scan testing while also shutting off power to certain parts of the chip would not only reduce the average power requirement, but would also address the power problems associated with delay testing and instantaneous switching. In addition, allowing parts of the chip to be shut-off allows testing under conditions that more closely match those encountered during functional operation. However, conventional scan testing designs and methods do not typically incorporate power-shutoff aware features.

Thus, there is a need for systems and methods that incorporate scan testing with power-shutoff aware features for ICs.

SUMMARY OF THE INVENTION

In one embodiment of the present invention, a method of making a circuit for scan testing includes: providing a plurality of circuit elements on a chip, wherein the circuit elements include memory elements for storing values; configuring the circuit elements into a plurality of power domains with separate power-level controls, including an always-on domain whose power-level is in a power-on state in an operational mode of the circuit and at least one independent power domain whose power level is in power-on state or a power-off state in the operational mode of the circuit; configuring the circuit elements to form a plurality of scan segments for loading values into circuit elements from input ends of the scan segments and unloading values from circuit elements at output ends of the scan segments, wherein each scan segment intersects at most one independent power domain; providing a decompressor circuit that receives a decompressor input and is operatively connected to the scan-segment input ends, wherein the decompressor circuit decompresses the decompressor input to generate input values for the scan segments; providing a compressor circuit that is operatively connected to the scan segment output ends and generates a compressor output, wherein the compressor circuit compresses output values from the scan segments to generate the compressor output; and providing isolation circuits at scan-segment exits from the at least one independent power domain, wherein the isolation circuits set values for scan segments at scan-segment exits when a corresponding independent power domain is in a power-off state.

According to one aspect of this embodiment, the method may further include providing one or more power sources operatively connected to the power domains and the separate power-level controls for delivering power to the power domains.

According to another aspect, configuring the circuit elements may include balancing lengths of the scan segments to reduce a variation in the scan-segment lengths.

According to another aspect, each circuit element may include a flip-flop or a latch for storing values.

According to another aspect, configuring the circuit elements may include balancing lengths of the scan segments to reduce a variation in the scan-segment lengths.

According to another aspect, configuring the circuit elements may include balancing a number of scan segments corresponding to each power domain to reduce a variation in the number of scan segments corresponding to each power domain, wherein scan segments corresponding to the always-on domain do not intersect any independent power domain and scan segments corresponding to an independent power domain intersect that independent power domain.

According to another aspect, the method may further include providing a plurality of value-observing circuits for observing values at scan-segment entrances of a first independent power domain, wherein each value-observing circuit is operatively connected at an entrance point of a corresponding scan segment at the first independent power domain.

According to another aspect, the method may further include increasing a compression ratio for the decompressor circuit so that values from every scan pin associated with the decompressor input are utilitzed during a scan test.

According to another aspect, the method may further include providing at least one masking circuit for the at least one independent power domain, wherein each masking circuit is operatively placed between the scan-segment output ends of scan segments that intersect a corresponding independent power domain and the compressor circuit; and providing a mask-control-logic circuit that is operatively connected to the at least one masking circuit, wherein the mask-control-logic circuit controls each masking circuit to set values for scan segments at scan-segment output ends when a corresponding independent power domain is in a power-on state.

In another embodiment of the present invention, a circuit adapted for scan testing, includes: a plurality of circuit elements disposed on a chip, wherein the circuit elements include memory elements for storing values; a first plurality of connections that configure the circuit elements into a plurality of power domains with separate power-level controls, including an always-on domain whose power-level is in a power-on state in an operational mode of the circuit and at least one independent power domain whose power level is in power-on state or a power-off state in the operational mode of the circuit; a second plurality of connections that configure the circuit elements to form a plurality of scan segments for loading values into circuit elements from input ends of the scan segments and unloading values from circuit elements at output ends of the scan segments, wherein each scan segment intersects at most one independent power domain; a decompressor circuit that receives a decompressor input and is operatively connected to the scan-segment input ends, wherein the decompressor circuit decompresses the decompressor input to generate input values for the scan segments; a compressor circuit that is operatively connected to the scan segment output ends and generates a compressor output, wherein the compressor circuit compresses output values from the scan segments to generate the compressor output; and a plurality of isolation circuits at scan-segment exits from the at least one independent power domain, wherein the isolation circuits set values for scan segments at scan-segment exits when a corresponding independent power domain is in a power-off state. This embodiment may include aspects described above.

In another embodiment of the present invention, a method of scan testing a circuit adapted for scan testing as described above includes: using a decompressor circuit that receives a decompressor input and is operatively connected to the scan-segment input ends, wherein the decompressor circuit decompresses the decompressor input to generate input values for the scan segments; loading values into the scan segments at the scan-segment input ends; moving values through the scan segments from the scan-segment input ends to the scan-segment output ends; varying at least one power level in at least one independent power domain while moving the values through the scan segments; unloading values from the scan segments at the scan-segment output ends using a compressor circuit that is operatively connected to the scan segment output ends and generates a compressor output, wherein the compressor circuit compresses output values from the scan segments to generate the compressor output; and using isolation circuits at scan-segment exits from the at least one independent power domain, wherein the isolation circuits set values for scan segments at scan-segment exits when a corresponding independent power domain is in a power-off state.

This embodiment may include aspects described above. According to another aspect, the method further include associating the scan segments with the power domains, wherein scan segments associated with the always-on domain do not intersect any independent power domain and scan segments associated with an independent power domain intersect that independent power domain; and varying the at least one power level in the at least one power domain includes testing scan segments in groups corresponding to their associated power domains.

Additional embodiments relate to an apparatus for carrying out any one of the above-described methods, where the apparatus includes a computer for executing instructions related to the method. For example, the computer may include a processor with memory for executing at least some of the instructions. Additionally or alternatively the computer may include circuitry or other specialized hardware for executing at least some of the instructions. Additional embodiments also relate to a computer-readable medium that stores (e.g., tangibly embodies) a computer program for carrying out any one of the above-described methods with a computer In these ways the present invention enables systems and methods that incorporate scan testing with power-shutoff aware features for ICs.

DETAILED DESCRIPTION OF EXEMPLARY EMBODIMENTS

Manufacturing scan testing typically includes connecting the state elements (e.g., flip-flops or latches) in the design into long chains of shift registers that allow the entire state of the design to be loaded (e.g., controlled) or unloaded (e.g., observed). These chains are generally known as either as scan chains or scan segments. In general, these terms can be used interchangeably. In some operational settings as described below, an initially provided scan chain configuration can be further subdivided into smaller chains or segments by utilizing additional circuitry for loading an unloading values in the smaller chain or segment.

Typically, scan chains or scan segments are connected under certain constraints, such as creating chains of a similar length (balancing) or minimizing the length of the wiring to connect the chains. Satisfying these constraints typically results in scan chain connections that zig-zag across the chip and into and out of the various sub-components.

Figure 1:
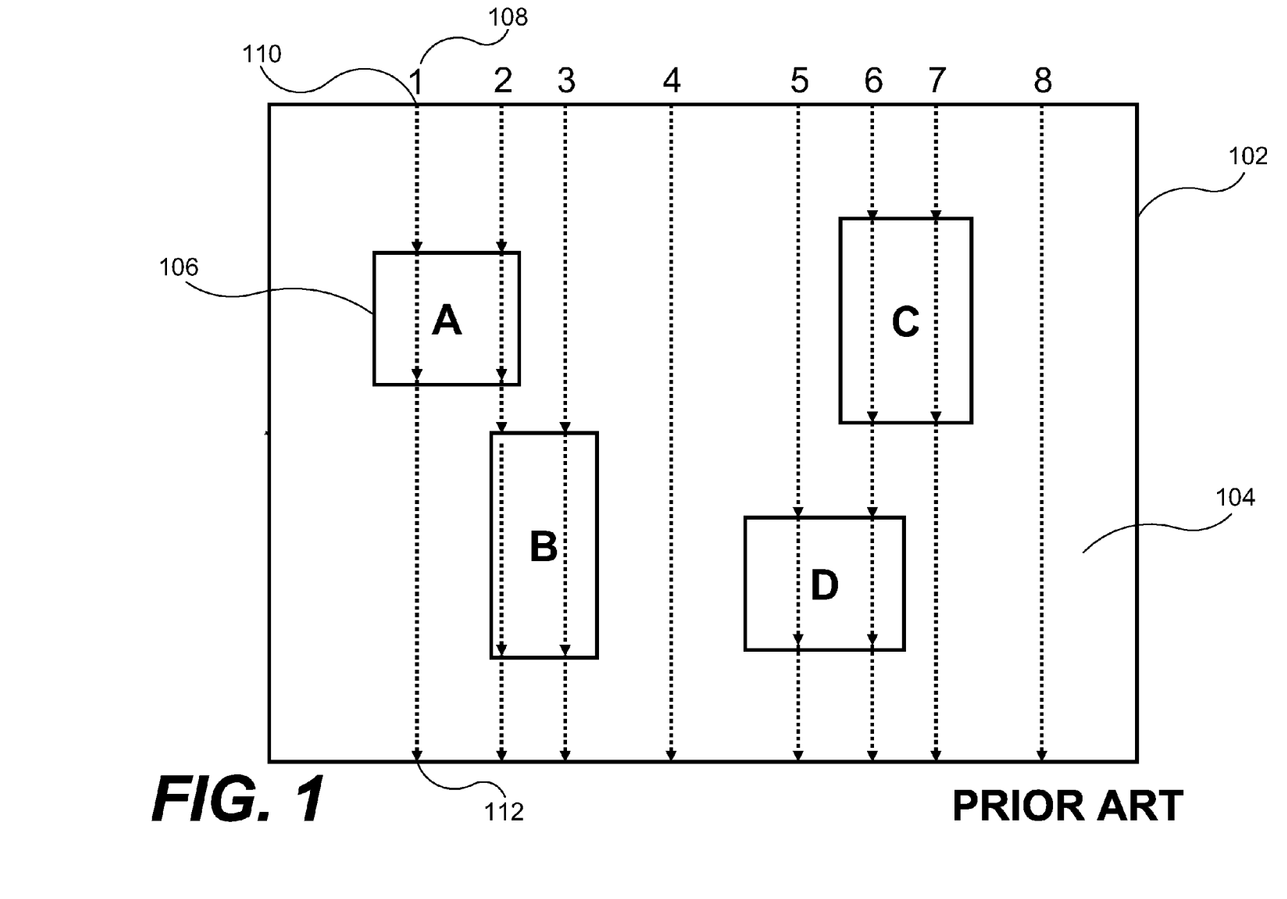
FIG. 1 shows a nominal scan configuration for a system-on-chip with multiple power domains.

FIG. 1 shows a nominal scan configuration for a system-on-chip 102 with multiple power domains. A top-level power domain 104, also denoted as an always-on power domain, is kept on in an operational mode of the system 102. Four independent power domains 106 are also shown with labels for power domains A, B, C, and D. Eight scan segments 108 are show with labels for scan segments 1-8. Arrows are shown on the scan segments 108 to show the movement of scan-segment values from the scan-segment input end 110 to the scan-segment output end 112. For simplicity, we show the scan chains as straight vertical lines, with the scan inputs at the top of the Figure and the scan outputs at the bottom of the Figure. Note that in order to satisfy the scan constraints, some of the scan chains include elements from multiple sub-components.

For example, scan chain 2 first includes scan elements from block A and later includes elements from block B. In reality, the scan chain configuration will typically be much more complex, entering and leaving multiple blocks multiple times. In order to minimize the time (number of clock cycles) to load and unload the state of the design, the chains are "balanced", in other words, an attempt is made to keep the lengths (number of bits) in each chain about equal. Balanced scan chains allows the chip to be tested as quickly as possible, which is required to minimize the cost of test. It is also desirable to minimize the wire length required to stitch the chains together. In order to achieve reduced wire length, the bits are stitched together in an optimal order and/or are assigned to the chain which minimized wire length the most.

These requirements on scan stitching typically result in chains that zig/zag across the chip, sometimes picking up sequential elements in block A, later including elements from block B, etc. . . . The downward arrows in FIG. 1 represent eight scan chains. The first chain labeled "1" on the left may include bits from the top level, then bits from block A, and final elements from the top level again. The second chain labeled "2" includes bits from both blocks A, block B, in addition to the top level 104. This figure unrealistically represents these scan chains as straight lines, but the important point is the fact that, in order to balance the chains and minimize wire length, in addition to other requirements, the scan chain path typically enters and leaves multiple blocks in the design, sometimes multiple times.

Now assume each of the blocks in FIG. 1 can be shut off independently, i.e., each block is a switchable power domain. Scan chains that cross multiple power domains will not function properly if one or more sections of the scan are powered down. For example, if domain A is powered off while domain B is on, the logic in B that scan chain 2 tests will not be controllable. This reduces the testability of block B when domain A is powered off. Such constraints on testability and power shut-off configurations can overly complicate the scan testing process and/or limit which power domain configurations can be used during scan test.

Figure 2:
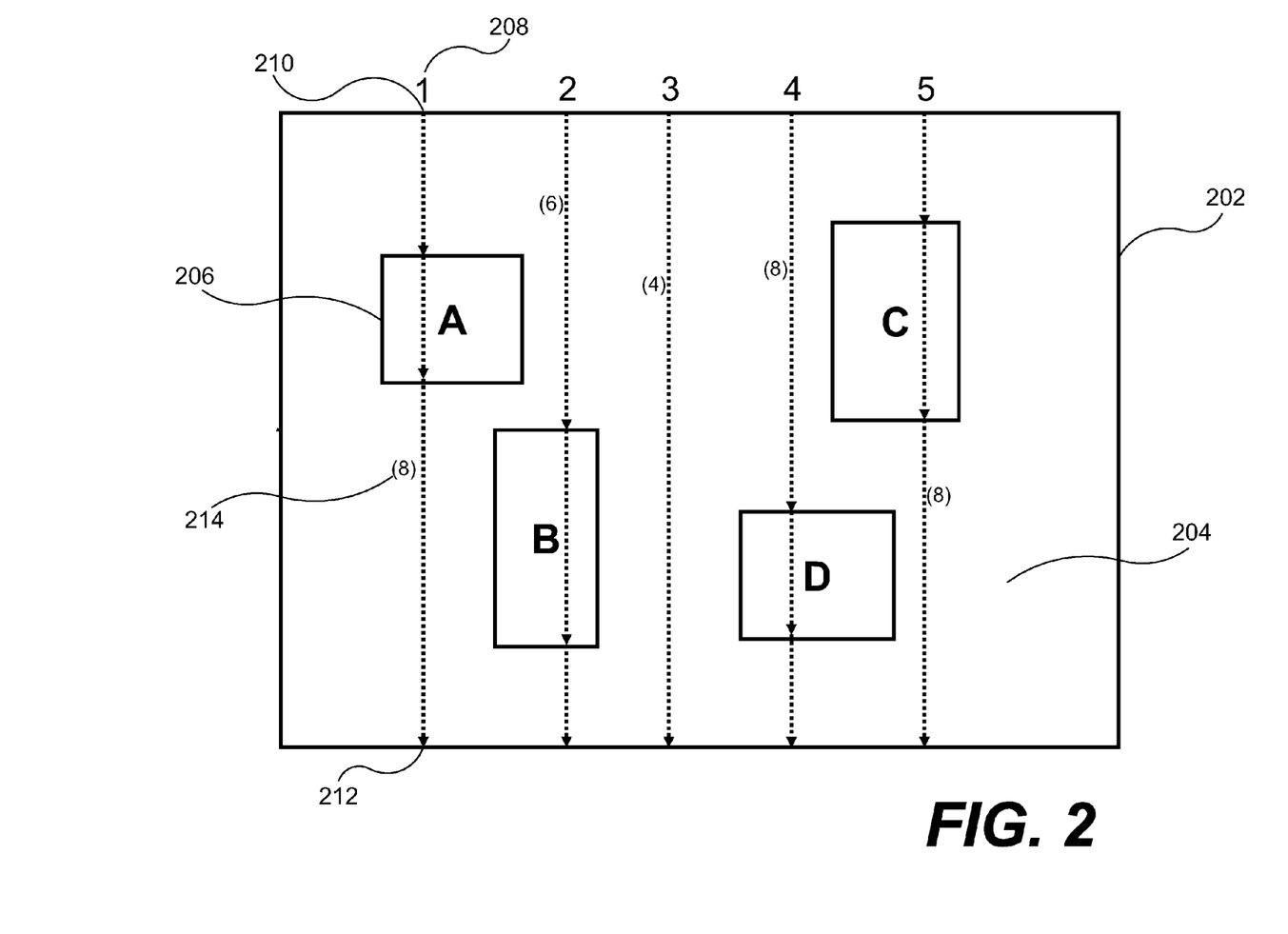
FIG. 2 shows a scan configuration where scan chains are dedicated to individual power domains.

FIG. 2 shows a scan configuration where scan chains are dedicated to individual power domains. A system-on-chip 202 includes multiple power-domains including a top-level always-on domain 204 and four independent power domains 206 with labels for power domains A, B, C, and D. Eight groups of scan segments 208 are shown with arrows to indicate the movement of scan-segment values along a scan segment 208 from the input end 210 to the output end 212. The number of segments (or chains) 214 in each set corresponding to a power domain is also shown parenthetically (e.g., 8 segments corresponding to power domain A).

This configuration includes a group of scan segments labeled 1 that are dedicated to power domain A. In other words, all sequential elements included in scan-segment group 1 are part of power domain A or the always on domain 104. Similarly, there is a group of segments labeled 2 that include only sequential elements from power domain B or the always on domain 104. By dividing the sequential elements in this way, the power level of one independent power domain indicates the usability of the corresponding scan segments for moving values. This architecture allows us to test any power configuration, all four independent domains powered off, one or more domains powered on, or an all powered on mode where every power domain is operational.

This solution has the advantage that it is fairly simple to implement. However, there are also disadvantages. First, unless there are a lot of scan I/O lines, balancing the scan chains may not be possible. This system 202 includes a circuit with 34 total scan chains. If this number were greatly reduced, the constraint that an individual chain be allocated to a single power domain would lead to unbalanced chains, or at least require careful planning to arrive at a reasonable balance.

Secondly, only a subset of the scan I/O is used when parts of the chip 202 are powered off, and this leads to an increase in the total time to perform scan testing. When the entire chip is powered on, all parts are tested in parallel. Suppose, for the sake of example, that 1000 test patterns allow us to test the chip sufficiently (i.e., reach some limit of fault coverage, say 99%). If the power domains are only tested one at a time, it may take 800 patterns to test the logic in power domain A (only the scan chains in group 1 will be used), 900 patterns for power domain B (only using the scan chains in group 2), 950 patterns for power domain C, and 850 patterns for power domain D. Testing the power domains separately requires 3500 patterns in total compared to 1000 patterns when all domains are powered-on.

Despite these limitations, there are situations (depending on the complexity of the chip, the test methodology employed, etc. . . . ) where the relatively simple architecture of this chip 202 may be desirable.

The scan configuration shown in FIG. 2 can be built in several steps. First, divide the scan elements in the design into groups based on which power domain each element belongs. Second, based on the number of elements in each power domain group and the number of available scan I/O lines (i.e., the number of scan chains for Input/Output), select the proportion of scan chains (or scan segments) to be allocated to each power domain. Third, for each scan chain, allocate a power domain and allocate a set of scan elements to that chain. Fourth, for each scan chain, connect the elements into a shift register and connect the shift register to the top level scan I/O.

Operation of the embodiment shown in FIG. 2 can proceed as follows: First, select the power mode testing order based on each domain's power requirements during a scan test, starting with mode with the least power consumption and ending with the mode that requires the most power. Second, in the order determined in the first step, select each power mode, and generate tests for the logic active in the selected power mode. The generated tests will power-off all domains except those that are active in the selected power mode. Third, apply the generated scan tests in the order determined in the first step to test the chip while employing power shut-off.

Figure 3:
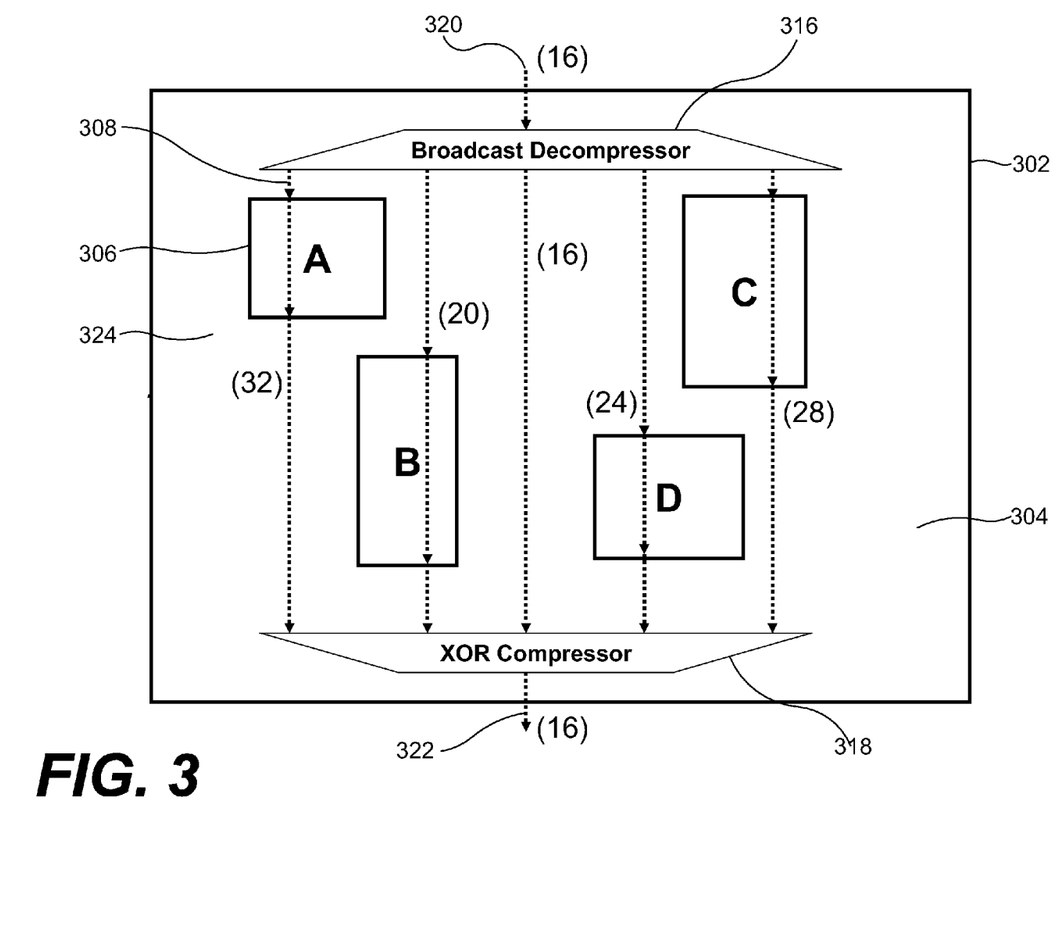
FIG. 3 shows an embodiment of the present invention where scan chains are dedicated to individual power domains and additional circuits are used for compression, decompression, and isolation.

Incorporation of scan compression into the design can advantageously enhance data throughput in the presence of arbitrary power domain shut-off. FIG. 3 shows an embodiment of the present invention where scan chains are dedicated to individual power domains and additional circuits are used for compression, decompression, and isolation. A system-on-chip 302 includes multiple power-domains including a top-level always-on domain 304 and four independent power domains 306 with labels for power domains A, B, C, and D. Groups of scan segments 308 are shown for each power domain with the number of scan segments listed in parentheses (e.g., the always-on power domain 304 is associated with sixteen (16) scan segments and the independent power domain A 306 is associated with thirty-two (32) scan segments). Similarly as in the above figures, arrows shown to indicate the movement of scan-segment values along a scan segment 308 from the input end to the output end. The number of segments (or chains) in each set corresponding to a power domain is also shown parenthetically (e.g., thirty-two (32) chains corresponding to power domain A).

In this context one could consider an initial scan configuration as shown in FIG. 2 where 8 scan chains 214 are initially provided for power domain A 206. Then, in order to take advantage of the compression/decompression circuits as described below, each of these initial scan chains 214 can be divided into four scan segments by utilizing additional circuitry for loading and unloading values of the corresponding scan elements so that the 8 scan chains corresponding to power domain A 206 in FIG. 2 result in 32 scan segments corresponding to power domain A 306 in FIG. 3. As noted above the terms scan chain and scan segment can be used interchangeably; however, the initial scan configuration (e.g., as in the scan chains in FIG. 2) can be modified to give alternative scan configurations (e.g., as in the scan segments in FIG. 3) according to the requirements of the operational setting.

A decompressor circuit 316 and compressor circuit 318 are provided at the scan-segment input and output ends respectively. The decompressor 316 receives a decompressor input 320 and generates scan-segment values at the scan-segment input ends. The compressor 318 receives scan-segment values at the scan-segment output ends and generates a compressor output 322.

Isolation circuits 324 are provided at scan-segment exit points from independent power domains 306 in order to set scan-segment values when a corresponding power domain 306 is in a power-off state.

In this configuration, scan segments targeting a predetermined length are inserted into each power domain. Ideally, the scan-segment length is selected to ensure there are at least as many scan segments in each power domain as there are top level chip scan I/O. As shown in FIG. 3, sixteen (16) scan segments are associated with the top-level always-on power domain 304.

In this embodiment, compression logic circuits 316, 318 are inserted into the chip at the top level (e.g., the always-on domain 304). In this case, the decompressor 316 is a broadcast decompressor and the compressor 318 is an XOR compressor. In general, however, any logic that expands (or compresses) a small set of input scan data into (or from) a larger set of scan channel data can be used. See, example, U.S. Pat. No. 7,103,816, "Method and System for Reducing Test Data Volume in the Testing of Logic Products," issued Sep. 5, 2006, and U.S. Pat. No. 6,782,501, "System for Reducing Test Data Volume in the Testing of Logic Products," issued Aug. 24, 2006, each of which is incorporated herein by reference in its entirety.

This scan channel control logic can be sequential or combinational in nature. Ideally, the segments could be connected in such a way that no matter which power domains were shut-off, all of the top level scan I/O would be used. This can typically be accomplished by assigning scan segments from always-on power domains first. If there are more always-on segments than scan I/O, we guarantee all scan I/O will always be used. If not, we connect the segments from the power domains in such a way as to maximize the number of scan I/O used in each power configuration. In general, because the number of compressed scan segments is so large, it is relatively easy to create balanced chains within the constraint that each segment is dedicated to an individual power domain.

When all domains are powered on, the compression logic operates as usual, feeding scan data through all the scan segments in the design. When a domain is powered off, the compressed scan segments dedicated to that domain will not function. It is desirable, however, that the scan data compressor receive predictable data at all of its inputs. This issue is automatically resolved during the power synthesis stage because isolation logic will be added to any signal that exits a switch-able power domain, including the output scan paths. Therefore, when a domain is powered off, the isolation logic will be activated and deliver a fixed value (typically logic zero) to the scan path and compressor. The isolation logic therefore prevents unknown values from entering the compressor logic that would otherwise deteriorate the compressor function. This effectively removes the powered off chains from the compression function, while still allowing the powered-on domains to be tested though the compression logic.

An additional aspect of the architecture 302 is the allocation of the scan segments to the decompressor 316 and compressor 318. Unlike the scan configuration presented in FIG. 2, as long as the compression ratio is high enough, we can ensure all the scan pins (and associated san lines of values) are used in every power mode. For example, in the case of a broadcast decompressor, shown in FIG. 3, there are 16 scan segments for logic that is always powered on. These 16 scan segments are connected to the decompressor so that each receives data from one of the 16 scan inputs. Similarly for the scan outputs, each one can be configured to receive data that is a function of at least one of the 16 always powered on chains. Using all scan I/O independent of the power mode is the most efficient way to deliver scan data to the chip. This also gives ATPG the most flexibility to target faults.

One of the design issues that any compression scheme has to address is the suppression or tolerance of a small percentage of unpredictable test responses captured from the logic under test. Unpredictable captured values can be due to a number of reasons such as un-modeled logic, internal three-state devices, hold time or setup time violations at capture flops etc. Many compression schemes employ masking logic at the tail of each scan channel to prevent these unknown values from entering the compression function. The masking logic is not needed however, for scan channels associated with powered off domains. In this case, the masking logic can be reconfigured to more efficiently target the remaining active scan channels.

Figure 4:
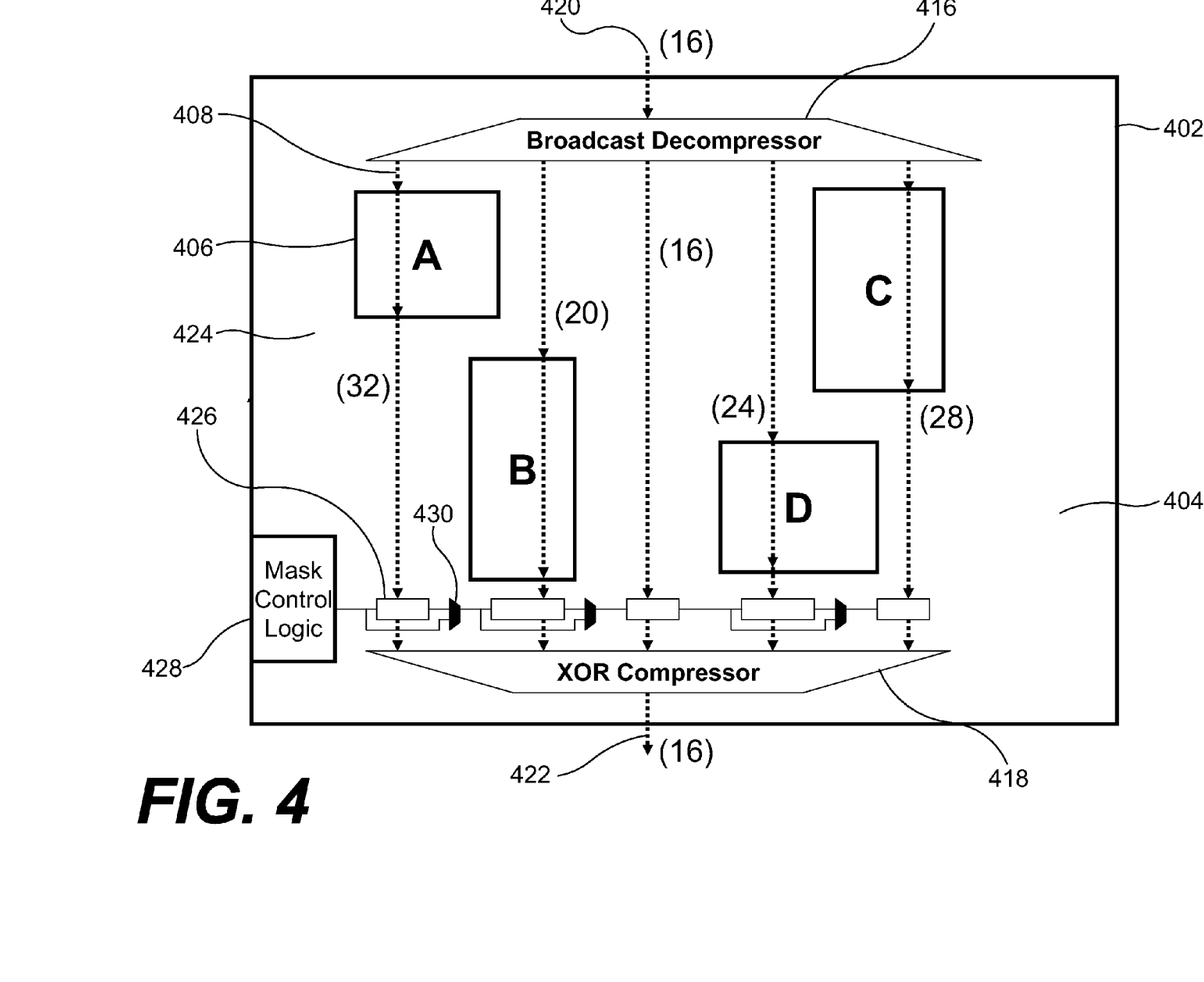
FIG. 4 shows an embodiment of the present invention that adds reconfigurable masking logic to the embodiment shown in FIG. 3.

FIG. 4 shows an embodiment that adds reconfigurable masking logic to the embodiment shown in FIG. 3. A system-on-chip 402 includes multiple power-domains including a top-level always-on domain 404 and four independent power domains 406 with labels for power domains A, B, C, and D. Similarly as in FIG. 3, groups of scan segments 408 are shown for each power domain with the number of scan segments listed in parentheses, and arrows shown to indicate the movement of scan-segment values along a scan segment 308 from the input end to the output end.

Also, as in FIG. 3, the system 402 includes a decompressor circuit 416 that receives a decompressor input 420 and generates scan-segment values at the scan-segment input ends and compressor circuit 418 that receives scan-segment values at the scan-segment output ends and generates a compressor output 422 Also isolation circuits 424 are provided at scan-segment exit points from independent power domains 406 in order to set scan-segment values when a corresponding power domain 406 is in a power-off state.

For each power domain, masking circuits 426 are placed between the scan-segment output ends and the compressor circuit 418 in order to provide systematic values to the compressor 418 when these scan segments have unknown values present. The masking circuits 426 are typically controlled from a set of inputs or a mask control block 428, which typically receives power from the always-on domain 404. In general each power domain including the always-on domain has an associated masking circuit 426 in order to facilitate testing of the system. In some operational settings, the mask circuitry 426 includes a mask register that requires loading via the mask control login 428, and bypass logic including muxes 430 can be used to allow the register to be loaded more quickly. As another example, the mask control signals could come from a reconfigurable mask decoder that can be configured to bypass the logic that is masking powered-off domains, giving more control to the logic masking powered on domains.

The embodiments shown in FIGS. 3-4 can be built in several steps. First, insert scan chains into the design minimizing the number of times a scan path enters and leaves a particular power domain. Second, select a segment (or subchain) length based on the number of top level scan I/O and the number of scan elements in the always powered on domains. This selection of segment length guarantees all scan I/O will be used in all power modes. Third, decrease the segment length as needed to meet the desired compression goals. Fourth, divide the initial scan chains into scan segments based on the segment length. The individual scan segments are created so they do not cross switchable power domain boundaries. Fifth, insert the compression logic (and optional masking logic) and connect the scan segments to the compression logic (and optional masking logic). Connect segments from the always powered-on domains so that all scan I/O will be used in all power modes. Connect segments from switch-able power domains to maximize the number of scan I/O that feed each domain.

Operation of the embodiments shown in FIGS. 3-4 may depend on the requirements of the operational setting as relates to ATPG. In order to perform ATPG for various power configurations or modes, it is necessary for the ATPG process to understand the available power modes. First, for each power mode it must be able to identify which parts of the chip are shut-off. This identification can be handled automatically, or if this is not possible, the shut-off logic can be manually identified. Secondly, the ATPG process must be able to generate the proper sequences to allow the Automatic Test Equipment (ATE) to place the chip into a specific power mode. Here ATPG makes use of the test logic that was inserted into the power manager, as discussed with respect to FIG. 8 below. Typically, a mode initialization sequence is sufficient and can be generated automatically during the power manager test logic insert process, or these sequences could also be generated manually.

To reduce the maximum power required during manufacturing scan tests, it is important to select an effective test scheme. If we were to begin by generating scan tests for the chip with all domains powered on, the maximum power required for these tests would be no lower than a scan test for a chip without power shut-off capabilities.

With these considerations in mind for minimizing power consumption, operation of the embodiments shown in FIGS. 3-4 can proceed as follows: First, select the power mode testing order based on the number of faults within the power domain and the power domain's impact on the power requirements during scan. Second, in the order determined in the first step, select each power mode, and generate tests for the logic active in the selected power mode. The generated tests will power-off all domains except those that are active in the selected power mode. Third, apply the generated scan tests in the order determined in the first step to test the chip while employing power shut-off. Fourth, if necessary or desired, include an uncompressed scan test in the all powered on mode.

This procedure begins by generating scan tests using the power mode that has the smallest fault set. After some level of fault coverage for that fault set is reached, we switch to the power mode that has the next smallest fault set and generate tests for that power mode. We continue selecting power modes and generating tests until finally, tests for the mode with the most active logic has been selected and tests have been generated. Typically, we expect the chip will have an all domains powered on mode and that ATPG will be run for that power mode last. After compressed scan tests have been generated for all available power modes, a set of uncompressed test in the all powered on mode could be generated if needed to achieve the desired fault coverage.

In general, we can expect the power consumption of the scan tests for the first power modes to decrease proportionally with the amount of logic that is shut-off As we transition to power modes that have a greater portion of the logic powered on, many of the faults in the active logic will have already been tested in previous power modes. Not only will this lower the number of test patterns needed to test the remaining faults, but it should also reduce the number of care bits in these patterns. This gives more freedom to lower the power consumption in the final pattern sets even further. For example, with fewer care bits in the patterns, it should be possible to apply quite effectively most of the low power techniques reviewed in the Introduction. Combining the power savings from power shut-off with these other techniques should result in an even greater drop in the power requirement during scan testing.

Figure 5:
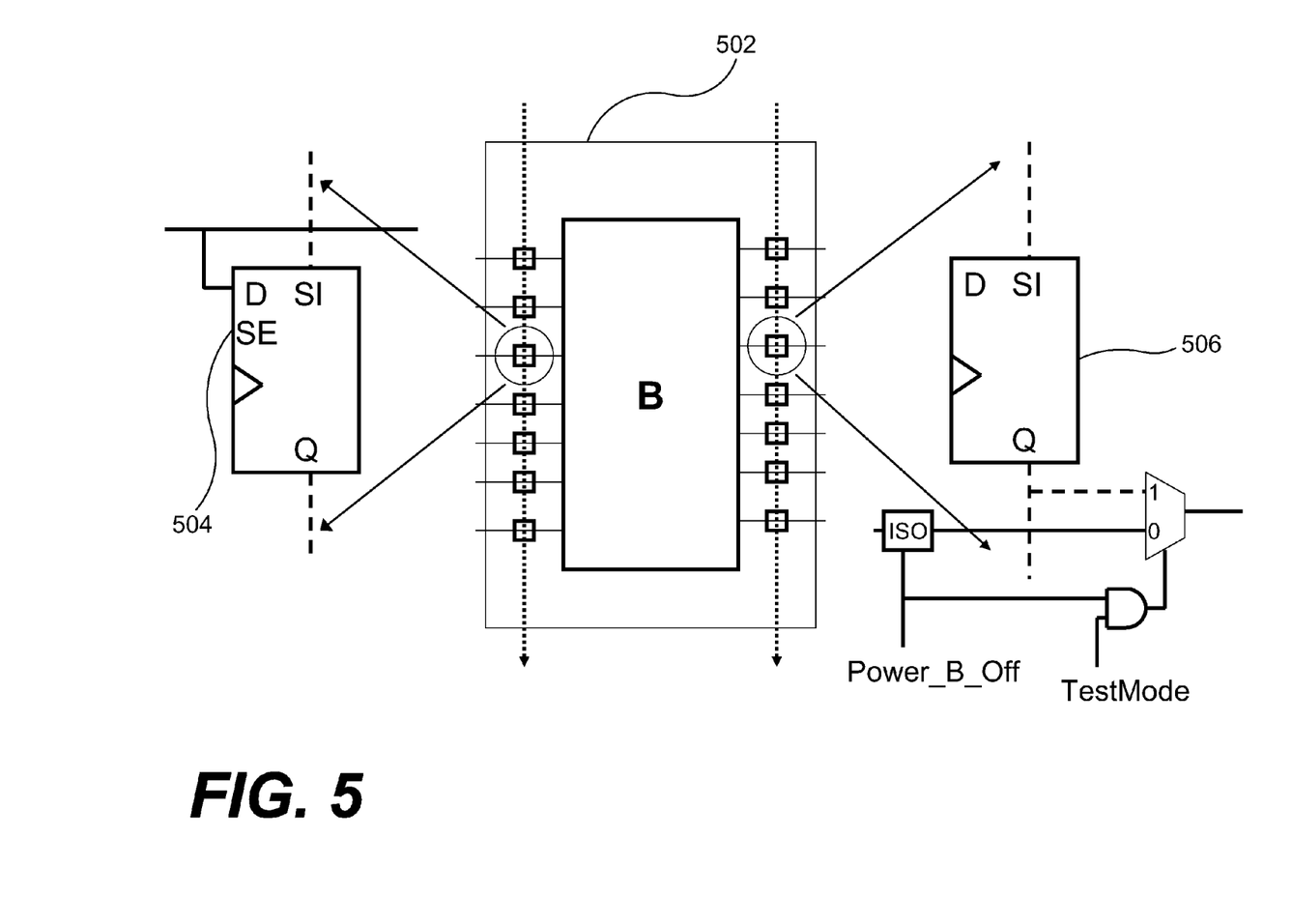
FIG. 5 shows an embodiment of the present invention that includes additional logic for observing values at entry points into a power domain and additional logic for controlling (e.g., setting) values at the exit points from the power domain as applied the embodiments shown in FIGS. 2-4.

The architectures in FIGS. 3-4 employ isolation logic 324, 424 to prevent unknown logic values from propagating from a powered off domain into powered on domains. Although this may be sufficient for the operation of the chip in functional mode, during test, some additional logic at the power domain boundaries will increase scan testing efficiency and coverage. FIG. 5 shows an embodiment for a power domain B 502 that includes additional logic 504 for observing values at entry points into the power domain 502 and additional logic 506 for controlling (e.g., setting) values at the exit points from the power domain 502. The value-observing circuit 504 includes a D latch with scan input (SI), scan output (Q), scan enable (SE), and clock input (>). The value-controlling circuit 506 includes a D latch with scan input (SI), scan output (Q), and clock input (>). The detail for the value-controlling circuit 506 includes power isolation circuitry (ISO) that receives a power shutoff signal (Power_B_Off), and test signal (Test-Mode) with related circuitry (e.g. AND gate and mux as shown).

Additional value-observing circuitry 504 and value-controlling circuitry 506 can increase the testability of the logic circuits outside a powered off domain 502. At the inputs to powered off domains, additional observation test points 504 make the logic that feeds this domain testable or easier to test. On the output side, isolation logic (shown as block ISO) is normally added to feed a fixed value into the powered on logic when subject domain 502 is powered off. These fixed values may not be sufficient for testing the logic outside the powered off domain. One solution, if one has the freedom, is to select isolation values that will make the logic the easiest to test. An alternative solution is to insert control test points along the output path by means of value-controlling circuitry 506 as shown. In the case when two switch-able power domains directly feed each other, the control and observe points can be combined into one control/observe test point with circuitry that is powered by the always-on domain.

Figure 6:
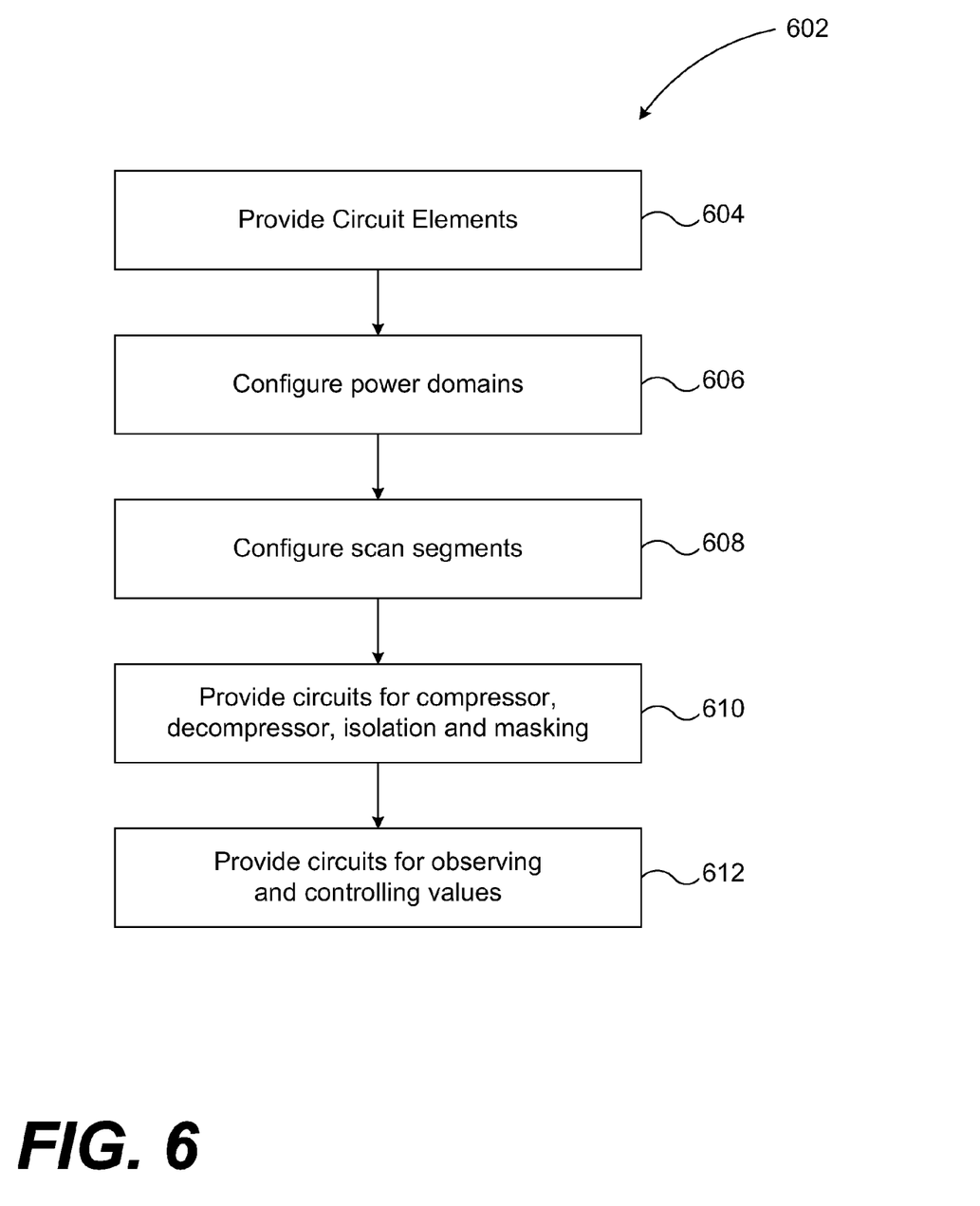
FIG. 6 shows an exemplary method according to the present invention for making a circuit for scan testing.

The embodiments described above with reference to FIGS. 3-5 can be employed in a variety of operational settings. FIG. 6 shows an exemplary method 602 according to the present invention for making a circuit for scan testing including providing circuit elements 604, configuring power domains 606, configuring scan segments 208, providing circuits for compression, decompressing, isolation and masking (e.g., as in FIGS. 3-4), and optionally providing circuits for observing and controlling values (e.g., as in FIG. 5).

Figure 7:
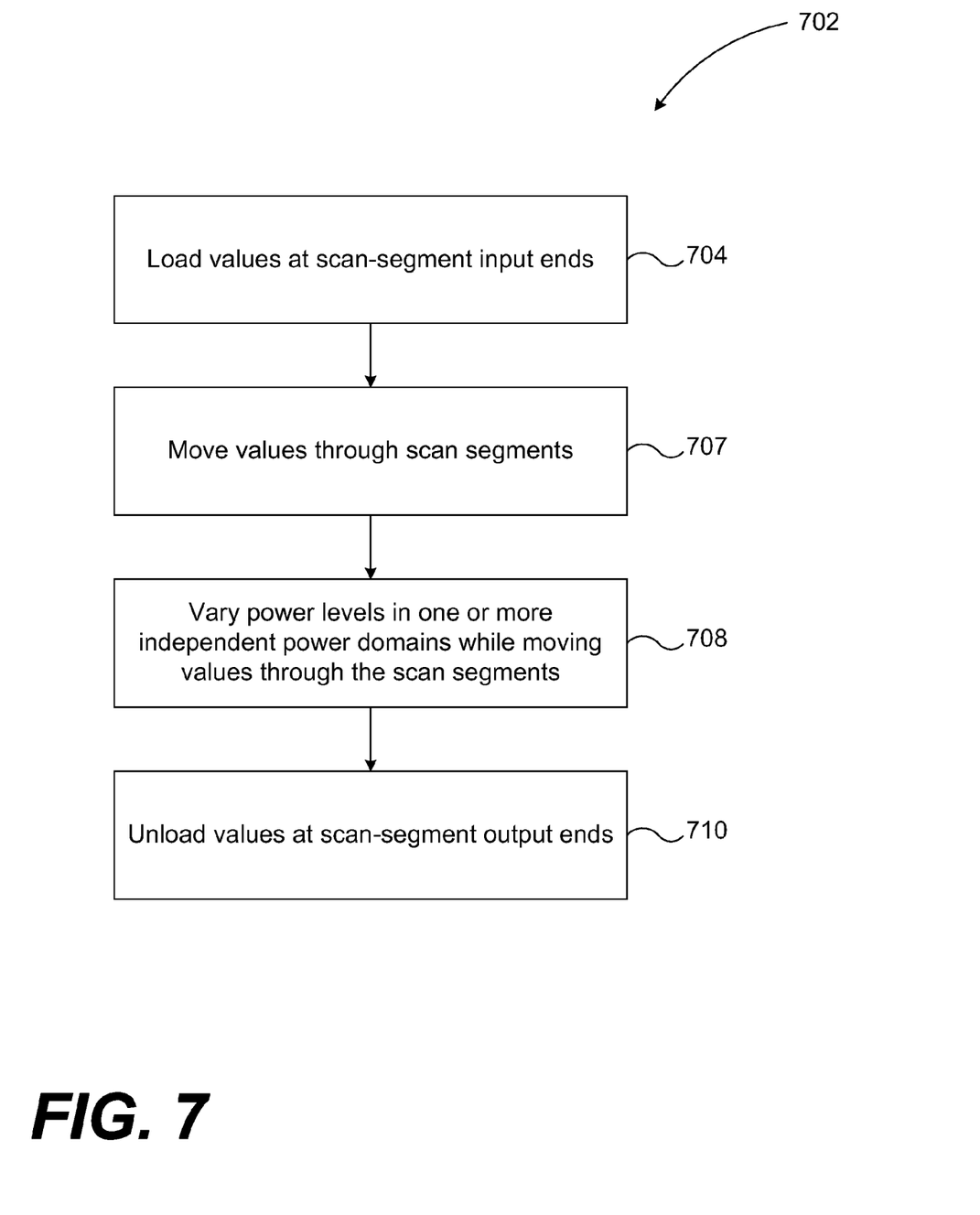
FIG. 7 shows an exemplary method according to the present invention for scan testing a circuit adapted for scan testing.

FIG. 7 shows a corresponding method 702 for scan testing a circuit adapted for scan testing (e.g., applicable to the scan segments 214, 308, 408 in FIGS. 2-4). The method 702 includes loading values at the scan-segment input ends 704, moving values through the scan segments 706, varying power levels in on or more independent power domains while moving values through the scan segments 708, and unloading values at scan-segment output ends 710. Note that in FIGS. 3 and 4 values are loaded 704 and unloaded 710 through decompressor and compressor circuits respectively.

Figure 8:
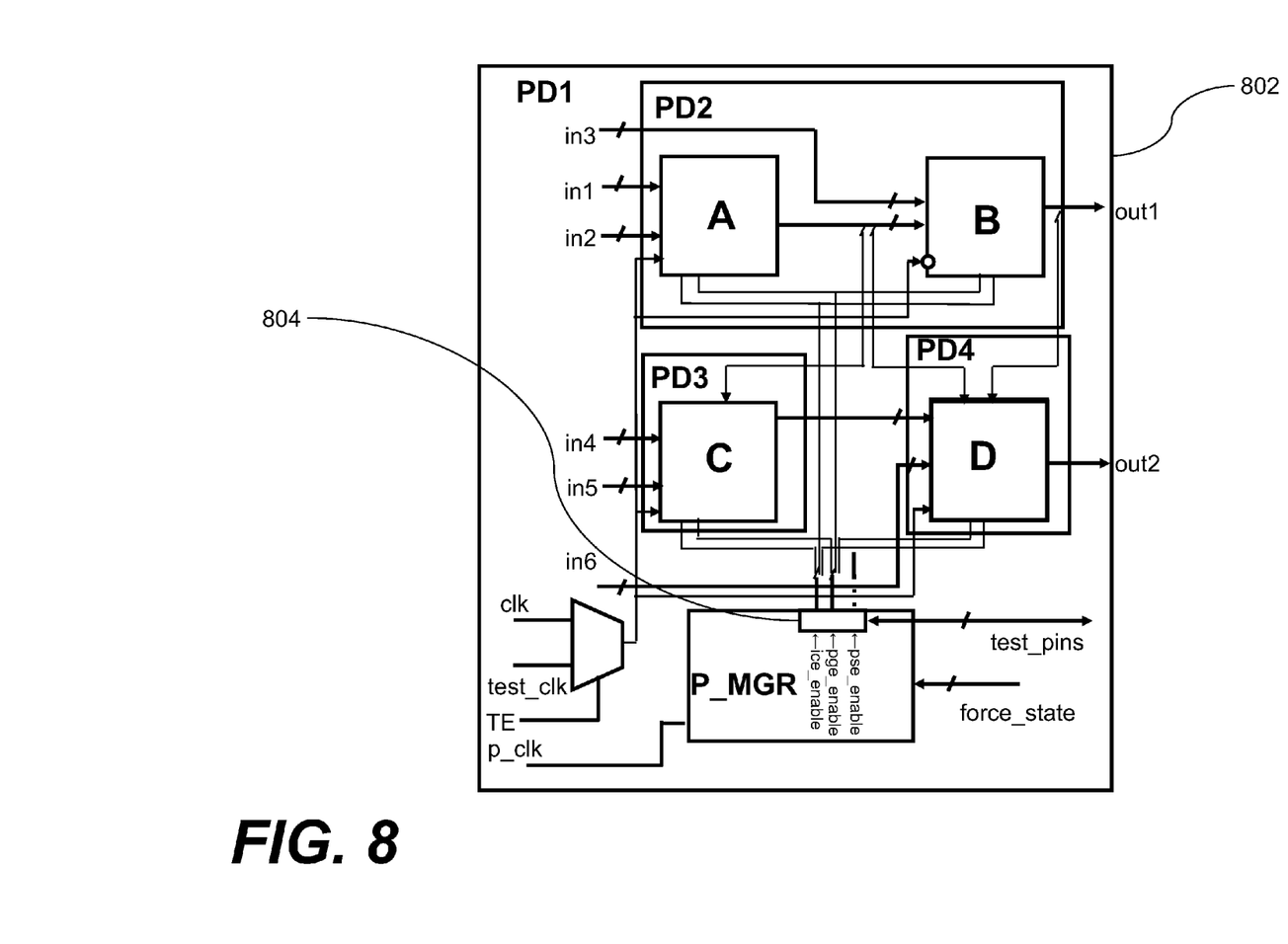
FIG. 8 shows an exemplary schematic for a power management system applicable to embodiments of the present invention.

The above-described embodiments can be applied to chip designs with power-shutoff features that are controllable during testing. Modern ASICs incorporating power shut-off capabilities typically include a power manager component that selectively shuts off parts of the chip depending on the functional operation the chip is performing. In order to control this shut-off logic during testing, additional test logic can be inserted into the power controller that allows direct control of the power shut-off signals. FIG. 8 shows an exemplary schematic for a power management system applicable to embodiments of the present invention. The system includes a chip 802 with four switch-able power domains labeled PD1 through PD4, where PD1 is an always on power domain that cannot be shut-off and PD2, PD3, and PD4 are switchable (e.g., independent) power domains that can be shut off. The power manager instance is labeled pm_inst and control a set of signals that control the power domain shut-off. To facilitate testing, additional logic 804 can be inserted in the power manager to give direct control of the power domain shut-off signals to the Automatic Test Equipment (ATE). With this additional logic, the ATE can place the chip into any of its functional power modes so that tests can be performed in these modes. Other conventional features are shown in FIG. 8 including device instances, input lines, output lines, clock signals and related control signals.

At least some values for the results of the methods described above can be output to a user or saved for subsequent use. For example the ATPG test results can be saved directly for evaluating the architecture. Alternatively, some derivative or summary form of the results (e.g., averages, interpolations, etc.) can be saved for later use according to the requirements of the operational setting.

Additional embodiments relate to an apparatus for carrying out any one of the above-described methods, where the apparatus includes a computer for executing computer instructions related to the method. In this context the computer may be a general-purpose computer including, for example, a processor, memory, storage, and input/output devices (e.g., keyboard, display, disk drive, Internet connection, etc.). However, the computer may include circuitry or other specialized hardware for carrying out some or all aspects of the method. In some operational settings, the apparatus may be configured as a system that includes one or more units, each of which is configured to carry out some aspects of the method either in software, in hardware or in some combination thereof. For example, the system may be configured as part of a computer network that includes the Internet.

At least some values for the results of the method can be saved, either in memory (e.g., RAM (Random Access Memory)) or permanent storage (e.g., a hard-disk system) for later use.

Additional embodiments also relate to a computer-readable medium that stores (e.g., tangibly embodies) a computer program for carrying out any one of the above-described methods by means of a computer. The computer program may be written, for example, in a general-purpose programming language (e.g., C, C++) or some specialized application-specific language. The computer program may be stored as an encoded file in some useful format (e.g., binary, ASCII).

Although only certain exemplary embodiments of this invention have been described in detail above, those skilled in the art will readily appreciate that many modifications are possible in the exemplary embodiments without materially departing from the novel teachings and advantages of this invention. For example, aspects of embodiments disclosed above can be combined in other combinations to form additional embodiments. Accordingly, all such modifications are intended to be included within the scope of this invention.

What is claimed is:

1. A method of making a circuit for scan testing, comprising:
    providing a plurality of circuit elements on a chip, wherein the circuit elements include memory elements for storing values;
    configuring the circuit elements into a plurality of power domains with separate power-level controls, including an always-on domain whose power-level is in a power-on state in an operational mode of the circuit and at least one independent power domain whose power level is in power-on state or a power-off state in the operational mode of the circuit;
    configuring the circuit elements to form a plurality of scan segments for loading values into circuit elements from input ends of the scan segments and unloading values from circuit elements at output ends of the scan segments, wherein each scan segment intersects at most one independent power domain;
    providing a decompressor circuit that receives a decompressor input and is operatively connected to the scan-segment input ends, wherein the decompressor circuit decompresses the decompressor input to generate input values for the scan segments;

providing a compressor circuit that is operatively connected to the scan segment output ends and generates a compressor output, wherein the compressor circuit compresses output values from the scan segments to generate the compressor output; and providing isolation circuits at scan-segment exits from the at least one independent power domain, wherein the isolation circuits set values for scan segments at scan-segment exits when a corresponding independent power domain is in a power-off state.

2. A method according to claim 1, further comprising: providing one or more power sources operatively connected to the power domains and the separate power-level controls for delivering power to the power domains.

3. A method according to claim 1, wherein each circuit element includes a flip-flop or a latch for storing values.

4. A method according to claim 1, wherein configuring the circuit elements includes balancing lengths of the scan segments to reduce a variation in the scan-segment lengths.

5. A method according to claim 1, wherein configuring the circuit elements includes balancing a number of scan segments corresponding to each power domain to reduce a variation in the number of scan segments corresponding to each power domain, wherein scan segments corresponding to the always-on domain do not intersect any independent power domain and scan segments corresponding to an independent power domain intersect that independent power domain.

6. A method according to claim 1, further comprising:
providing a plurality of value-observing circuits for observing values at scan-segment entrances of a first independent power domain, wherein each value-observing circuit is operatively connected at an entrance point of a corresponding scan segment at the first independent power domain.

7. A method according to claim 1, further comprising:
providing a plurality of value-controlling circuits for controlling values at scan-segment exits of a first independent power domain, wherein each value-controlling circuit is operatively connected at an exit point of a corresponding scan segment at the first independent power domain.

8. A method according to claim 1, further comprising:
increasing a compression ratio for the decompressor circuit so that values from every scan pin associated with the decompressor input are utilized during a scan test.

9. A method according to claim 1, further comprising:
providing at least one masking circuit for the at least one independent power domain, wherein each masking circuit is operatively placed between the scan-segment output ends of scan segments that intersect a corresponding independent power domain and the compressor circuit; and providing a mask-control-logic circuit that is operatively connected to the at least one masking circuit, wherein the mask-control-logic circuit controls each masking circuit to set values for scan segments at scan-segment output ends when a corresponding independent power domain is in a power-on state.

10. A circuit adapted for scan testing, comprising:
a plurality of circuit elements disposed on a chip, wherein the circuit elements include memory elements for storing values;
a first plurality of connections that configure the circuit elements into a plurality of power domains with separate power-level controls, including an always-on domain whose power-level is in a power-on state in an operational mode of the circuit and at least one independent power domain whose power level is in power-on state or a power-off state in the operational mode of the circuit;
a second plurality of connections that configure the circuit elements to form a plurality of scan segments for loading values into circuit elements from input ends of the scan segments and unloading values from circuit elements at output ends of the scan segments, wherein each scan segment intersects at most one independent power domain;
a decompressor circuit that receives a decompressor input and is operatively connected to the scan-segment input ends, wherein the decompressor circuit decompresses the decompressor input to generate input values for the scan segments;
a compressor circuit that is operatively connected to the scan segment output ends and generates a compressor output, wherein the compressor circuit compresses output values from the scan segments to generate the compressor output; and
a plurality of isolation circuits at scan-segment exits from the at least one independent power domain, wherein the isolation circuits set values for scan segments at scan-segment exits when a corresponding independent power domain is in a power-off state.

11. A circuit according to claim 10, further comprising: one or more power sources operatively connected to the power domains and the separate power-level controls for delivering power to the power domains.

12. A circuit according to claim 10, wherein each circuit element includes a flip-flop or a latch for storing values.

13. A circuit according to claim 10, further comprising: a plurality of value-observing circuits for observing values at scan-segment entrances of a first independent power domain, wherein each value-observing circuit is operatively connected at an entrance point of a corresponding scan segment at the first independent power domain.

14. A circuit according to claim 10, further comprising: a plurality of value-controlling circuits for controlling values at scan-segment exits of a first independent power domain, wherein each value-controlling circuit is operatively connected at an exit point of a corresponding scan segment at the first independent power domain.

15. A circuit according to claim 10, further comprising:
at least one masking circuit for the at least one independent power domain, wherein each masking circuit is operatively placed between the scan-segment output ends of scan segments that intersect a corresponding independent power domain and the compressor circuit; and
a mask-control-logic circuit that is operatively connected to the at least one masking circuit, wherein the mask-control-logic circuit controls each masking circuit to set values for scan segments at scan-segment output ends when a corresponding independent power domain is in a power-on state.

16. A method of scan testing a circuit adapted for scan testing, the circuit including a plurality of circuit elements disposed on a chip, wherein the circuit elements include memory elements for storing values, a first plurality of connections that configure the circuit elements into a plurality of power domains with separate power-level controls, including an always-on domain whose power-level is in a power-on state in an operational mode of the circuit and at least one independent power domain whose power level is in power-on state or a power-off state in the operational mode of the circuit, and a second plurality of connections that configure the circuit elements to form a plurality of scan segments for loading values into circuit elements from input ends of the scan segments and unloading values from circuit elements at output ends of the scan segments, wherein each scan segment intersects at most one independent power domain, the method comprising:

using a decompressor circuit that receives a decompressor input and is operatively connected to the scan-segment input ends, wherein the decompressor circuit decompresses the decompressor input to generate input values for the scan segments;

loading values into the scan segments at the scan-segment input ends; moving values through the scan segments from the scan-segment input ends to the scan-segment output ends;

varying at least one power level in at least one independent power domain while moving the values through the scan segments;

unloading values from the scan segments at the scan-segment output ends     using a compressor circuit that is operatively connected to the scan segment output ends and generates a compressor output, wherein the compressor circuit compresses output values from the scan segments to generate the compressor output; and     using isolation circuits at scan-segment exits from the at least one independent power domain, wherein the isolation circuits set values for scan segments at scan-segment exits when a corresponding independent power domain is in a power-off state.

17. A method according to claim 16, further comprising:

associating the scan segments with the power domains, wherein scan segments associated with the always-on domain do not intersect any independent power domain and scan segments associated with an independent power domain intersect that independent power domain; and     varying the at least one power level in the at least one power domain includes testing scan segments in groups corresponding to their associated power domains.

18. A method according to claim 16, further comprising; using value-observing circuits for observing values at scan-segment entrances of a first independent power domain, wherein each value-observing circuit is operatively connected at an entrance point of a corresponding scan segment at the first independent power domain.

19. A method according to claim 16, further comprising; using value-controlling circuits for controlling values at scan-segment exits of a first independent power domain, wherein each value-controlling circuit is operatively connected at an exit point of a corresponding scan segment at the first independent power domain.

20. A method according to claim 16, further comprising:

associating the scan segments with the power domains, wherein scan segments associated with the always-on domain do not intersect any independent power domain and scan segments associated with an independent power domain intersect that independent power domain; and     varying the at least one power level in the at least one power domain includes testing scan segments in groups corresponding to their associated power domains while using the isolation circuits to set values for scan segments associated with independent power domains in the power-off state.

21. A method according to claim 16, further comprising:

using at least one masking circuit for the at least one independent power domain, wherein each masking circuit is operatively placed between the scan-segment output ends of scan segments that intersect a corresponding independent power domain and the compressor circuit; and     using a mask-control-logic circuit that is operatively connected to the at least one masking circuit, wherein the mask-control-logic circuit controls each masking circuit to set values for scan segments at scan-segment output ends when a corresponding independent power domain is in a power-on state.

\* \* \* \* \*

UNITED STATES PATENT AND TRADEMARK OFFICE
CERTIFICATE OF CORRECTION

| | | |
|---|---|---|
| PATENT NO. | : 8,001,433 B1 | |
| APPLICATION NO. | : 12/345950 | |
| DATED | : August 16, 2011 | |
| INVENTOR(S) | : Sandeep Bhatia et al. | |

It is certified that error appears in the above-identified patent and that said Letters Patent is hereby corrected as shown below:

On Title page 2, under "Other Publications", in column 1, line 7, delete "Vetors,"" and insert -- Vectors," --, therefor.

On Title page 2, under "Other Publications", in column 2, line 6, delete "1998," and insert -- 1999, --, therefor.

In Drawing Figure 7, below Reference Numeral 704, line 1, delete "707" and insert -- 706 --, therefor.

In column 3, line 18, delete "utilitized" and insert -- utilized --, therefor.

In column 4, line 33, after "computer" insert -- . --.

In column 5, line 8, delete "an" and insert -- and --, therefor.

In column 10, line 42, after "Shut-off" insert -- . --.

In column 11, line 40, delete "on" and insert -- one --, therefor.

Signed and Sealed this
Third Day of July, 2012

David J. Kappos
*Director of the United States Patent and Trademark Office*